United States Patent
Zhuang

(10) Patent No.: US 7,346,862 B2
(45) Date of Patent: Mar. 18, 2008

(54) METHOD AND APPARATUS FOR OPTIMIZING A LOGIC NETWORK IN A DIGITAL CIRCUIT

(75) Inventor: Nan Zhuang, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 11/207,274

(22) Filed: Aug. 19, 2005

(65) Prior Publication Data

US 2007/0044045 A1   Feb. 22, 2007

(51) Int. Cl.
*G06F 17/50* (2006.01)
(52) U.S. Cl. ......................................................... 716/2
(58) Field of Classification Search ................. 716/2
See application file for complete search history.

(56) References Cited

U.S. PATENT DOCUMENTS

| | | | | |
|---|---|---|---|---|
| 4,703,435 A * | 10/1987 | Darringer et al. | ............. | 716/18 |
| 4,816,999 A * | 3/1989 | Berman et al. | ................. | 716/2 |
| 4,916,627 A * | 4/1990 | Hathaway | ..................... | 716/6 |
| 5,189,629 A * | 2/1993 | Kohnen | .......................... | 716/2 |
| 5,257,201 A * | 10/1993 | Berman et al. | ................. | 716/2 |
| 5,282,147 A * | 1/1994 | Goetz et al. | ..................... | 716/2 |
| 5,504,690 A * | 4/1996 | Kageyama et al. | ............. | 716/2 |
| 5,524,082 A * | 6/1996 | Horstmann et al. | ............ | 716/2 |
| 5,587,919 A * | 12/1996 | Cheng et al. | .................... | 716/2 |
| 5,721,690 A * | 2/1998 | Asaka | .......................... | 716/18 |
| 5,774,369 A * | 6/1998 | Horstmann et al. | ............ | 716/2 |
| 6,102,964 A * | 8/2000 | Tse et al. | ....................... | 716/18 |
| 6,237,132 B1* | 5/2001 | Dean et al. | ..................... | 716/18 |
| 6,301,687 B1* | 10/2001 | Jain et al. | ....................... | 716/3 |
| 6,470,482 B1* | 10/2002 | Rostoker et al. | ................ | 716/6 |
| 6,721,926 B2* | 4/2004 | Wang et al. | ..................... | 716/2 |
| 6,954,910 B2* | 10/2005 | Teig et al. | ...................... | 716/3 |
| 7,010,763 B2* | 3/2006 | Hathaway et al. | .............. | 716/2 |
| 7,024,639 B2* | 4/2006 | Teig et al. | ...................... | 716/3 |
| 7,100,143 B2* | 8/2006 | Teig et al. | ...................... | 716/18 |
| 2006/0230367 A1* | 10/2006 | Baumgartner et al. | ......... | 716/3 |

\* cited by examiner

*Primary Examiner*—Phallaka Kik
*Assistant Examiner*—Patrick Sandoval
(74) *Attorney, Agent, or Firm*—Park, Vaughan & Fleming LLP

(57) ABSTRACT

One embodiment of the present invention provides a system that optimizes a logic network. During operation, the system receives a first logic network which defines a logical function, wherein the first logic network cannot be efficiently optimized by directly using an optimization process that preserves the logical function. Next, the system creates an intermediate logic network based on the first logic network, wherein the intermediate logic network defines an intermediate logical function which is different from the logical function, wherein the intermediate logic network can be efficiently optimized using the optimization process. The system then optimizes the intermediate logic network using the optimization process to create an optimized intermediate logic network. Next, the system creates an optimized first logic network based on the optimized intermediate logic network. In this way, the system indirectly uses the optimization process to efficiently optimize the first logic network.

21 Claims, 8 Drawing Sheets

METHOD AND APPARATUS FOR OPTIMIZING A LOGIC NETWORK IN A DIGITAL CIRCUIT

BACKGROUND

1. Field of the Invention

The present invention relates to techniques for logic synthesis. More specifically, the present invention relates to a method and an apparatus for optimizing a logic network in a digital circuit.

2. Related Art

Rapid advances in computing technology presently make it possible to perform trillions of operations each second on data sets that are sometimes as large as a trillion bytes. These advances can be largely attributed to the exponential increase in the density and complexity of integrated circuits. High-density integrated circuits, such as a CPU chip, can have logic gate densities up to 500,000 gates per $mm^2$, which makes it possible to implement many complex logical functions.

A logical function is performed by a group of interconnected logic gates, which is referred to as a "logic network". Among the commonly used logic gates, exclusive-OR (hereinafter "XOR") gates are widely used in arithmetic circuits, communications circuits, and coding schemes for error detection and correction. Particularly, XOR gates are commonly used in hardware implementations for Cyclic Redundancy Codes (CRC), which are designed to detect burst errors in data storage systems and communication applications. Specifically, a CRCn system can receive, check and validate a block of n-bit long binary data for transmission errors, and is able to detect single-bit and double-bit errors, odd numbers of errors, burst errors less than or equal to n-bit, and most burst errors greater than n-bits long.

For the previous example, a hardware implementation of the CRCn system typically uses a cascade XOR gate structure, which is also referred to as an "XOR-tree." Note that for a system that implements CRCn there can be as many as n gate levels in the cascade structure, which may result in long gate delays. Furthermore, the cascade structure can miss redundant logic identification and removal in the XOR-tree and common logic sharing among the XOR-trees.

Normally, for an XOR-tree with a small number of inputs (typically less than eight), one can effectively convert it into a sum of product (SOP) representation, which facilitates optimizing the tree structure. However, an XOR-tree in SOP form has a size (number of cubes) that increases exponentially with the number of inputs. For example, a 16-input XOR-tree has a SOP representation of $2^{15}$, or 32768 cubes in a flattened structure. Commonly, industrial EDA tools optimize the XOR-trees with large number of inputs using two methods: (1) balance the XOR-trees; and (2) do limited flattening. The first method can reduce gate delays by reducing gate levels, but can miss the common logic sharing. The second method can identify some of the logic sharing, but can not minimize the gate delays, and can not identify all the common logic sharing.

The XOR-tree optimization has been a difficult synthesis problem for a very long time. In the last two decades, powerful synthesis tools have been developed for AND-OR based logic networks. Unfortunately, so far no effective synthesis tool has been developed which can optimize an XOR logic network to minimize delay and chip area at the same time.

As a result, in the applications such as CRC, XOR logic has typically been implemented using cascade structures. Besides delay and speed problems, there are further problems. For example, it is also difficult to identify and remove redundant logic.

Hence, what is needed is a method and an apparatus for optimizing XOR-trees of any size and complexity in order to minimize delay and chip area without running into the above described problems.

SUMMARY

One embodiment of the present invention provides a system that optimizes a logic network. During operation, the system receives a first logic network which defines a logical function, wherein the first logic network cannot be efficiently optimized by directly using an optimization process that preserves the logical function. Next, the system creates an intermediate logic network based on the first logic network, wherein the intermediate logic network defines an intermediate logical function which is different from the logical function, wherein the intermediate logic network can be efficiently optimized using the optimization process. The system then optimizes the intermediate logic network using the optimization process to create an optimized intermediate logic network. Next, the system creates an optimized first logic network based on the optimized intermediate logic network. In this way, the system indirectly uses the optimization process to efficiently optimize the first logic network.

In a variation on this embodiment, the first logic network is comprised of only logic gates of a first type.

In a further variation on this embodiment, the logic gates of the first type are symmetric logic gates.

In a variation on this embodiment, the system creates an intermediate logic network based on the first logic network by first identifying the primary outputs of the first logic network. Next, the system identifies the primary inputs associated with each of the primary outputs. The system then removes redundant primary inputs. Next, the system removes the logic gates of the first type from the first logic network, and subsequently adds a logic gate of a second type for each of the primary outputs of the first logic network. Note that, after adding logic gates of the second type, each primary output of the first logic network becomes an output of a logic gate of the second type, and each primary input of the first logic network becomes an input of a logic gate of the second type.

In a variation on this embodiment, the system optimizes the intermediate logic network using the optimization process by: minimizing timing delay by reducing logic levels and sharing common logic. Specifically, the system shares common logic by first identifying common logic in cases where two logic cones are found to have the same set of inputs, but different outputs. If common logic is identified, the system removes one of the logic cones.

In a variation on this embodiment, the system creates an optimized first logic network based on the optimized intermediate logic network by first replacing each logic gate of the second type in the optimized intermediate network with a logic gate of the first type, wherein the logic gate of the first type retains all of the inputs and all of the outputs of the logic gate of the second type. Next, the system verifies a logical function for each primary output. Specifically, the system verifies logical functions for each primary output by: identifying a set of primary inputs associated with the primary output; comparing the set of primary inputs with the set of primary inputs associated with the same primary output in the first logic network; and confirming that the two sets of primary inputs are identical.

In a variation on this embodiment, the system optimizes a logic network by: receiving a logic network, wherein the logic network comprises logic gates of different types; identifying a sub-network within the logic network, wherein the sub-network comprises only logic gates of a first type; optimizing the sub-network to produce an optimized sub-network; and optimizing the logic network by substituting the sub-network with the optimized sub-network.

DETAILED DESCRIPTION

Integrated Circuit Design Flow

Figure 1:
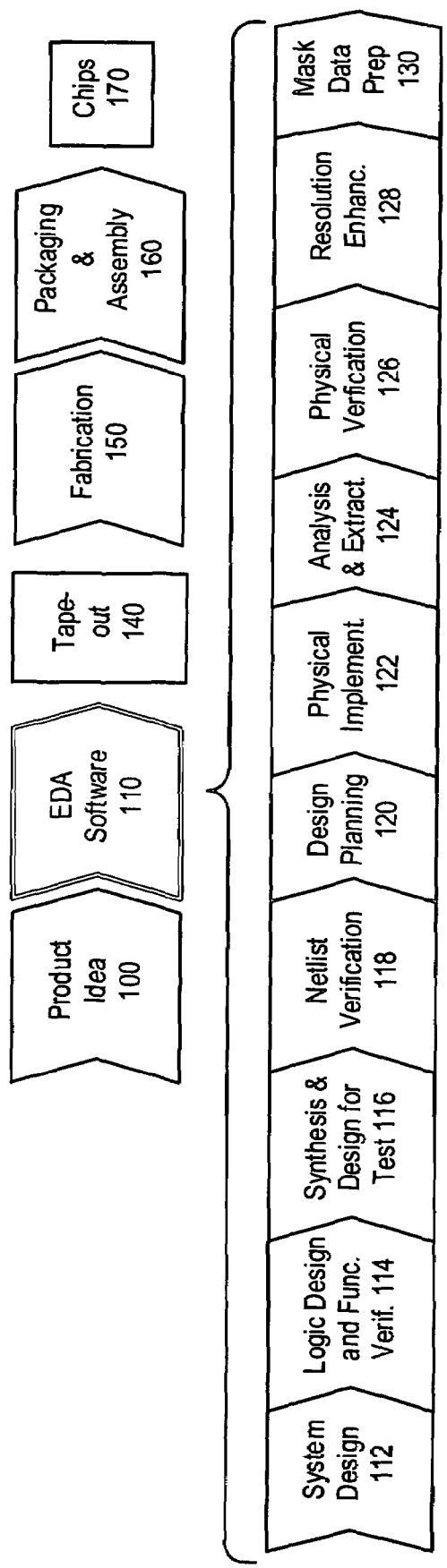
FIG. 1 illustrates an exemplary integrated circuit design flow in accordance with an embodiment of the present invention.

FIG. 1 illustrates an exemplary integrated circuit design flow in accordance with an embodiment of the present invention.

The process starts with the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. Note that the design flow description is for illustration purposes only. Specifically, this description is not meant to limit the present invention. For example, an actual integrated circuit design may require the designer to perform the design steps in a different sequence than the sequence described below.

The following text provides a brief description of the steps in the design process (step 110).

System design (step 112): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include Astro-Rail, PrimeRail, Primetime, and Star RC/XT products.

Physical verification (step 126): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks for lithographic use to produce finished chips. Exemplary EDA software products from Synopsys, Inc. that can be used at this step include the CATS(R) family of products.

Note that embodiments of the present invention can be used during one or more of the above described steps. Specifically, one embodiment of the present invention can be used during the synthesis and design for test step 116.

Issues in a Cascade XOR-Tree

Figure 2:
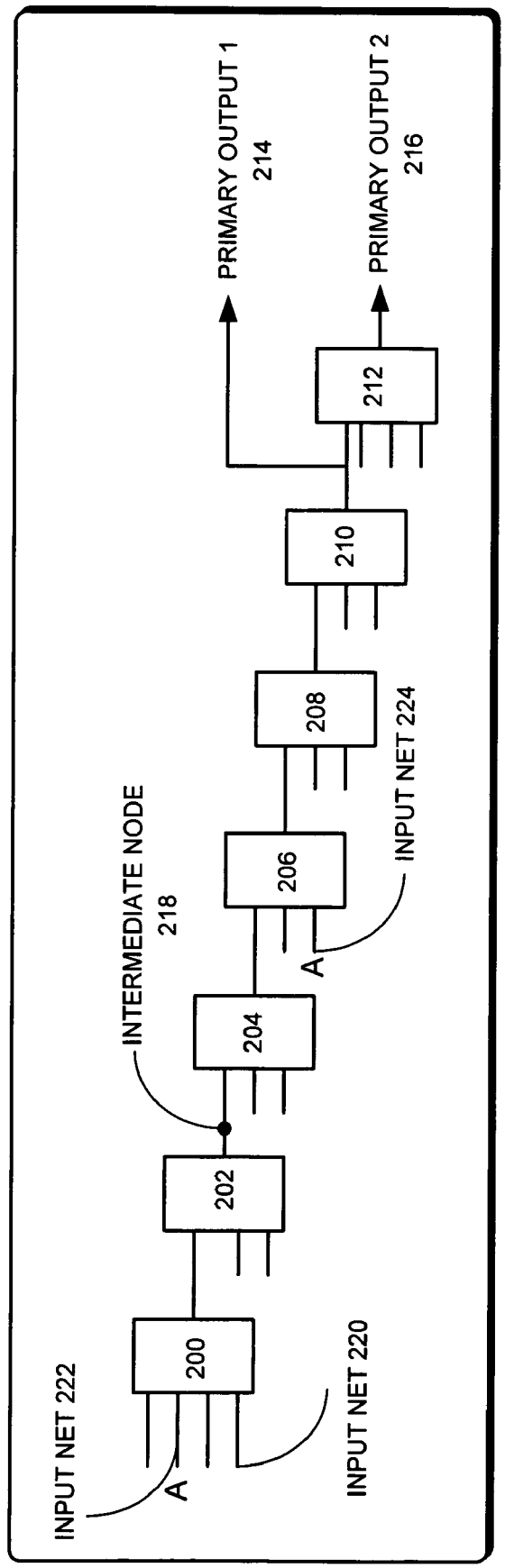
FIG. 2 illustrates a critical path of a CRC16 implementation using XOR gates in accordance with an embodiment of the present invention.

FIG. 2 illustrates a critical path of a CRC 16 implementation using XOR gates in accordance with an embodiment of the present invention. Boxes 200, 202, 204, 206, 208, 210, and 212 from left to right are seven consecutive XOR gates, each with 3 or 4 inputs cascaded together in 7 levels. The XOR-tree has two primary outputs 214 and 216. A primary output is an output that goes outside the tree structure. In contrast, the output of gate 202 is not a primary output because it only goes into gate 204 within the tree structure. Net 218 is referred to as an "intermediate node." As explained in the background section, a signal that goes into input net 220 will suffer gate delays from all 7 gate levels before it reaches the primary output 216.

The cascade XOR-tree shown in FIG. 2 not only has gate delay problems that affect chip speed, but also has two other issues. One issue is redundancy. For example, in FIG. 2, input nets 222 and 224 are both connected to the same input signal A. Since XOR gates are symmetric with respect to primary outputs 214 and 216, input nets 220 and 224 can be swapped. Due to that "A XOR A=0", and "Y XOR 0=Y", input nets 222 and 224 are redundant logically. In a complex logic network, such redundancy may exist in many places.

Figure 3A:
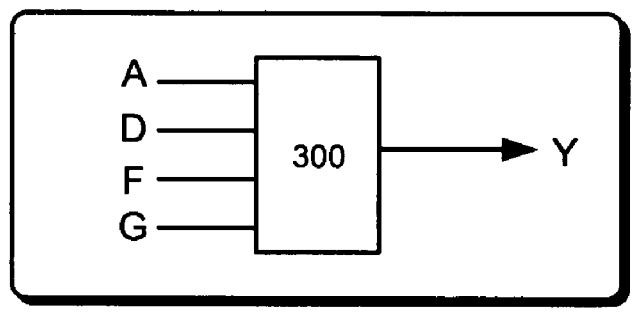
FIG. 3A illustrates a 4-input XOR gate in a logic network in accordance with an embodiment of the present invention.
Figure 3B:
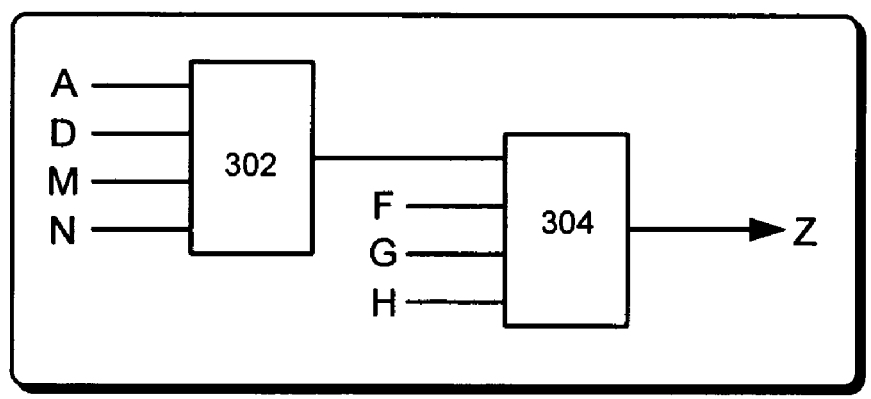
FIG. 3B illustrates two cascaded 4-input XOR gates in the same logic network as FIG. 3A in accordance with an embodiment of the present invention.
Figure 3C:
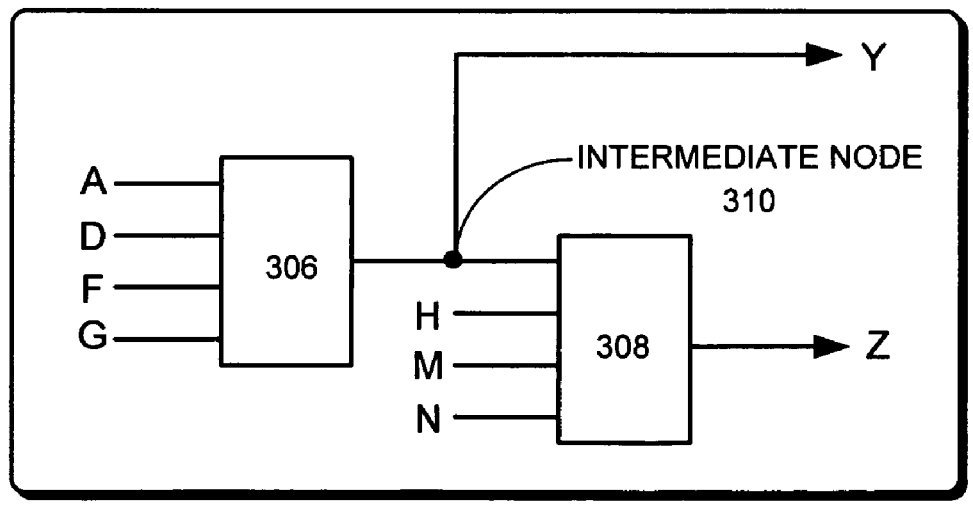
FIG. 3C illustrates two cascaded 4-input XOR gates which are logically equivalent to the network in FIG. 3A and FIG. 3B in accordance with an embodiment of the present invention.

Another issue in a cascade structure has to do with common logic sharing. FIGS. 3A-3C illustrate the concept of common logic sharing in a logic network in accordance with an embodiment of the present invention. More specifically, FIG. 3A illustrates a 4-input XOR gate 300 in a logic network with one primary output signal Y and four input signals A, D, F, and G. Additionally, FIG. 3B shows two cascaded 4-input XOR gates 302 and 304 located in the same logic network with one primary output signal Z and its associated input signals A, D, M, N, F, G, and H. FIG. 3C illustrates two cascaded 4-input XOR gates 306 and 308 which are logically equivalent to the network in FIG. 3B, even though the signals are routed differently. Note that XOR gate 306 shares the same inputs as XOR gate 300, which are A, D, F, and G. Therefore, gates 300 and 306 have common logic. Consequently, the circuits FIG. 3A and FIG. 3B can be replaced by the circuit in FIG. 3C, which has the output Y attached to its intermediate node 310. As a result, through common logic sharing, the number of gates in the logic network can be reduced.

Logic Synthesis Using an Intermediate Logic

Figure 4:
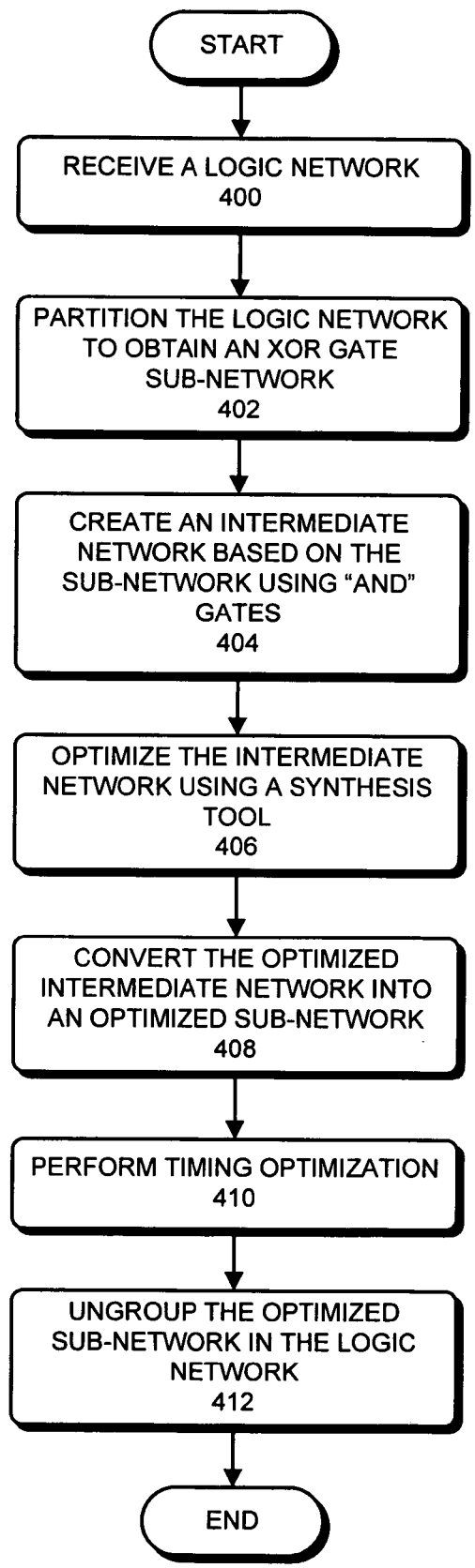
FIG. 4 presents a flowchart illustrating the process of synthesizing an XOR logic network using an intermediate logic network in accordance with an embodiment of the present invention.

FIG. 4 presents a flowchart illustrating the process of synthesizing an XOR logic network using an intermediate logic network in accordance with an embodiment of the present invention.

The synthesis process typically begins upon receiving a logic network (step 400). This logic network can contain different types of nodes, including but not limited to AND, NAND, OR, NOR, XOR, XNOR, NOT gates, registers, operators, memories, etc.

Figure 5:
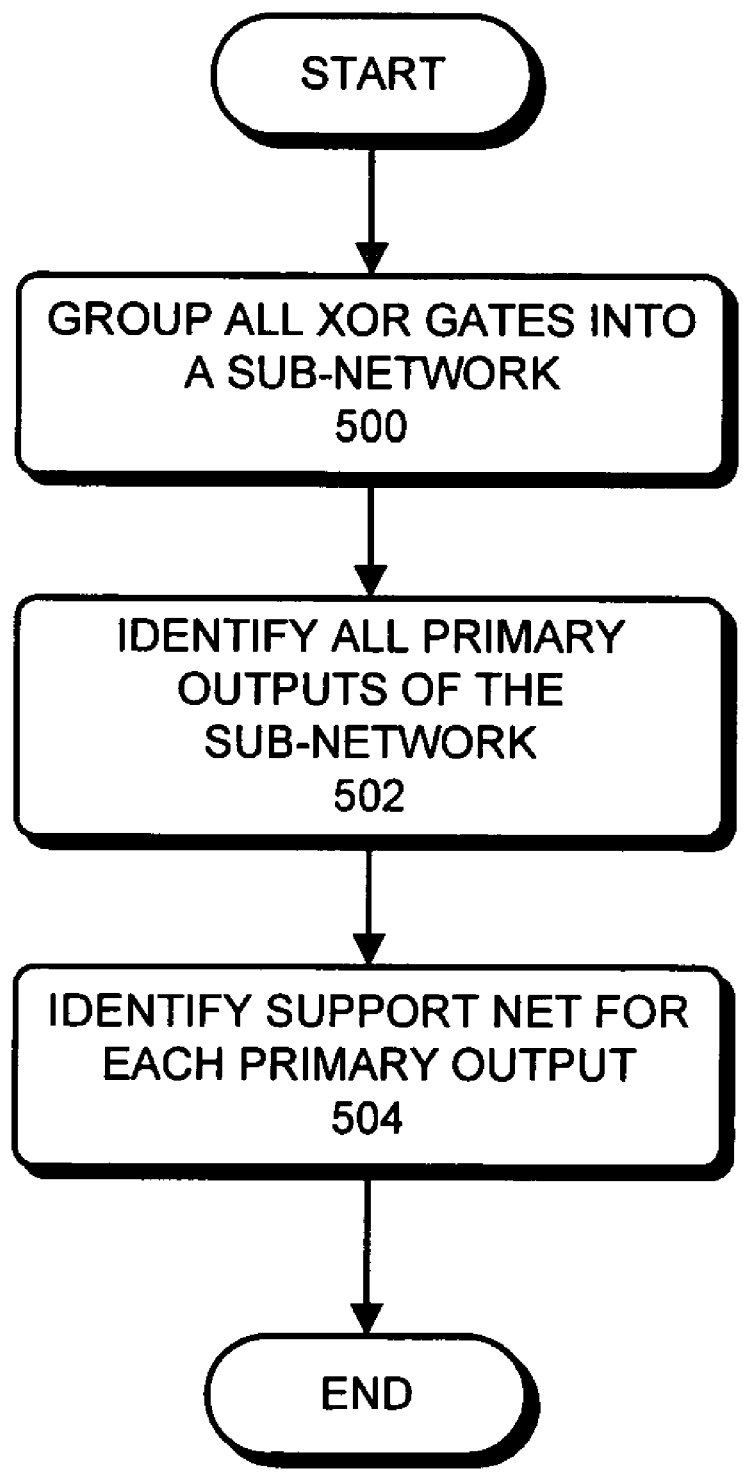
FIG. 5 presents a flowchart illustrating the process of partitioning XOR gates in a logic network to obtain an XOR sub-network in accordance with an embodiment of the present invention.

Next, the process partitions all the XOR gates in the logic network to obtain an XOR sub-network (step 402). FIG. 5 presents a flowchart illustrating the process of partitioning XOR gates in a logic network to obtain an XOR sub-network in accordance with an embodiment of the present invention. The partition process first groups together all the XOR gates in the network into an XOR sub-network (step 500). Then the process identifies all the "primary outputs" of the XOR sub-network (step 502), which are outputs of the XOR gates that go beyond the boundary of the XOR sub-network. Next, the process identifies all the inputs associated with primary outputs of the XOR sub-network (step 504). These inputs are referred to as the "support nets" of the primary outputs.

Figure 6:
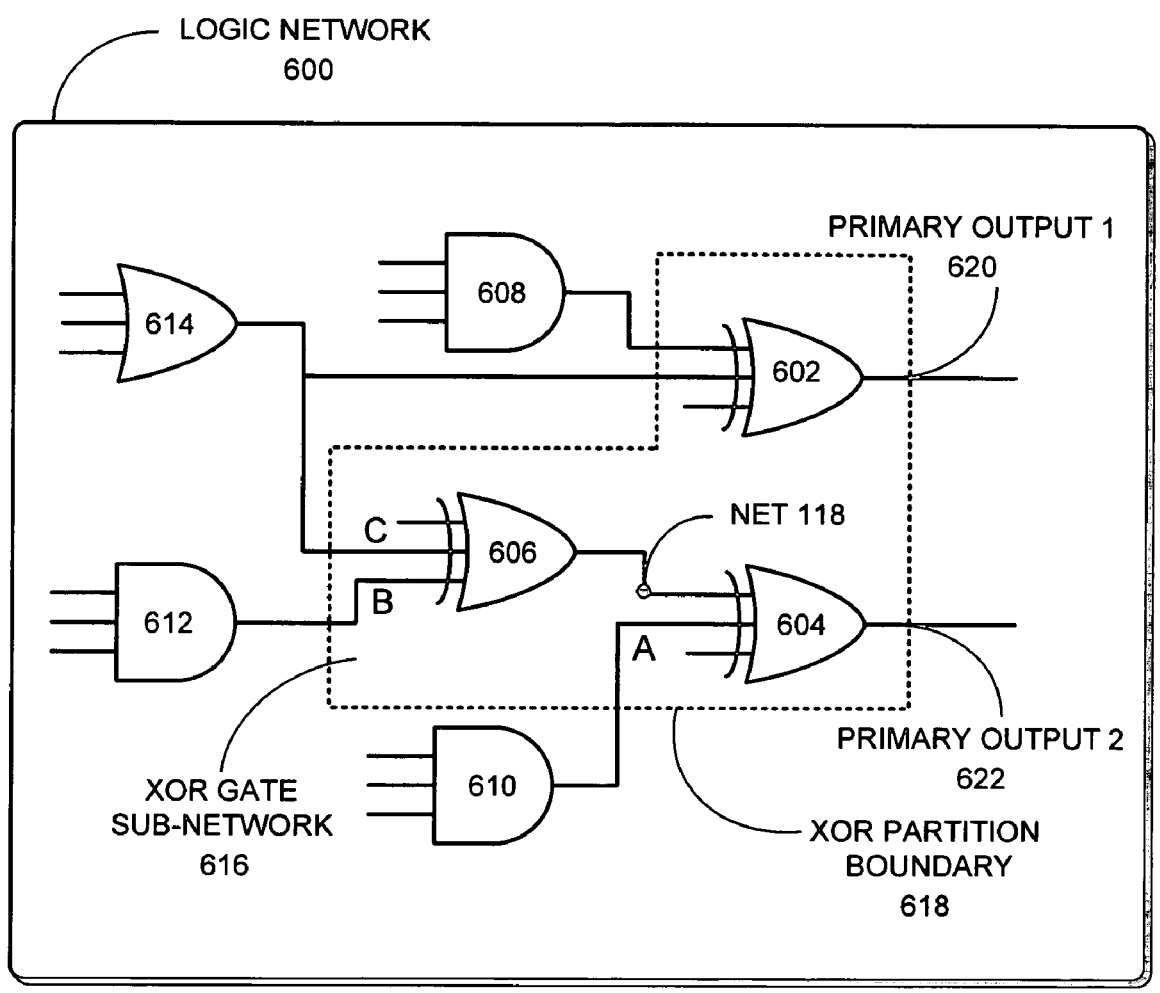
FIG. 6 illustrates an exemplary XOR gate partition in a logic network in accordance with an embodiment of the present invention.

FIG. 6 illustrates an exemplary XOR gate partition in a logic network in accordance with an embodiment of the present invention. The logic network 600 includes seven logic gates: three XOR gates 602, 604, and 606; three AND gates 608, 610, and 612; and one OR gate 614. These gates are interconnected into 3 levels. Note that the XOR gates have been partitioned into an XOR sub-network 616 which is a 2-level XOR-tree. XOR sub-network 616 is enclosed in the partition boundary 618. There are only two primary outputs for XOR sub-network 616, namely primary output 1 (620) and primary output 2 (622). The support nets for primary output 2 comprise only three inputs, A, B and C, which are the outputs from gates 610, 612, and 614, respectively. Note that internal net 118 is not a primary output since it does not cross partition boundary 618.

Once the XOR sub-network is fully partitioned, the synthesis process of FIG. 4 then creates an intermediate logic network based on the sub-network, wherein the intermediate network is comprised of only "easy gates" (step 404). Generally, a logic network comprised of "easy gates" can be efficiently optimized using existing synthesis tools. Examples of "easy gates" include AND gates, OR gates, and any other gates which are symmetric and easy to be represented with traditional Boolean network, or even an abstract "vertex" of a graph. Without losing generality, AND gates will be used to represent "easy gates" in the following description, but the process is also applicable to the other "easy gates" listed above.

Creating and Optimizing an Intermediate Network

Figure 7:
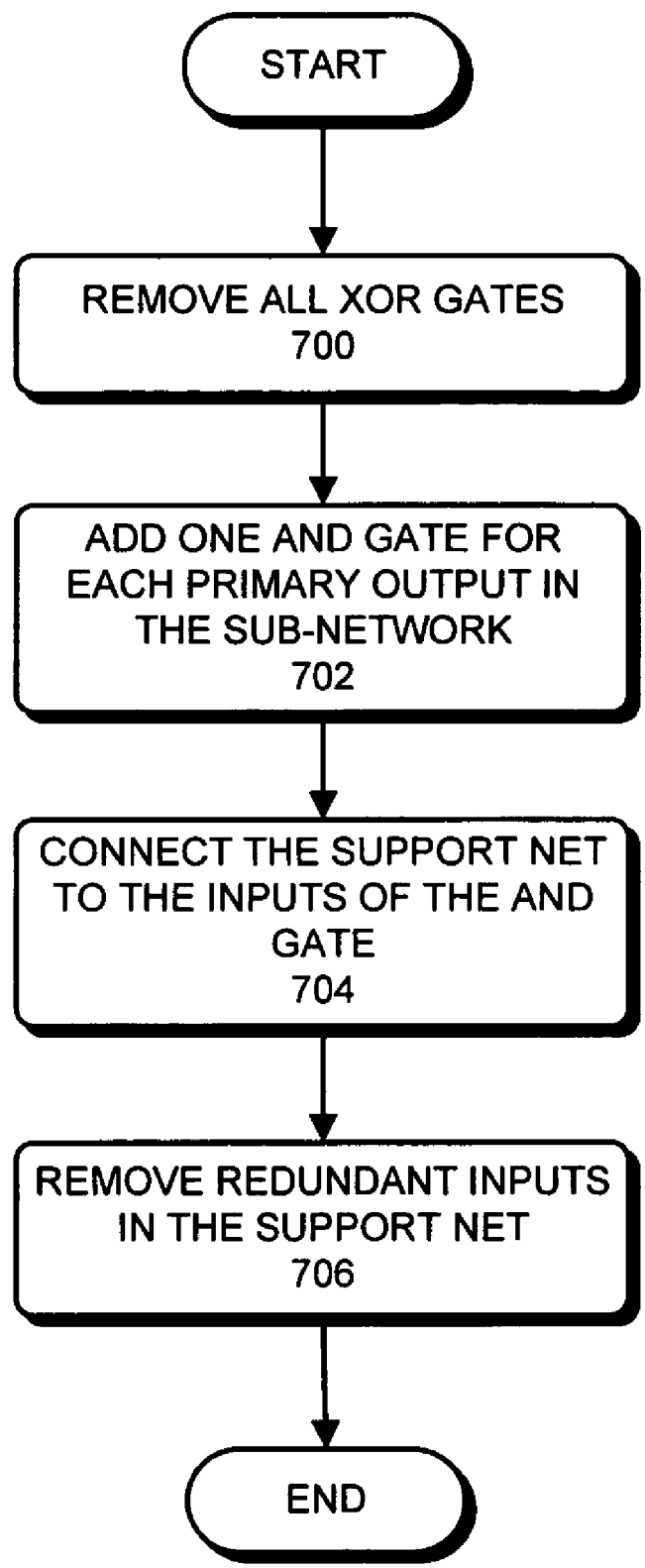
FIG. 7 presents a flowchart illustrating the process of creating an intermediate logic network of easy gates based on the XOR sub-network in accordance with an embodiment of the present invention.

FIG. 7 presents a flowchart illustrating the process of creating an intermediate logic network of easy gates based on the XOR sub-network in accordance with an embodiment of the present invention. The process begins by first removing all the XOR gates from the XOR sub-network (step 700). Next, the process adds one AND gate for each primary output in the XOR sub-network, so that the AND gate output becomes the primary output (step 702). The process then connects the support nets for this primary output to the inputs of the AND gate (step 704). Finally, the process identifies and removes any redundant inputs in the support nets (step 706). Note that, this AND gate intermediate network is a one-level network. It is possible to generate a "large gate" in the intermediate network which has more inputs than any available AND gate in the technology library. However, this one-level intermediate network is not optimized. Furthermore, note that by converting the XOR sub-network into the AND intermediate network, the logical function has completely changed. This is a fundamental difference between the present invention and prior art systems, which are constrained to preserve logical function in each synthesis step. Note that, even though retaining the logical function of the original sub-network is not required in the intermediate network, at the end of the synthesis process, the logical function of the sub-network should be restored and preserved.

Going back to the synthesis process flow in FIG. 4, the process next optimizes the AND gate intermediate network using a synthesis tool suitable for the "easy gates" network (step 406). Some of the well-known synthesis tools for this purpose are MIS-II for multilevel logic optimization, and ESPRESSO for two-level logic minimization, developed by UC Berkeley, and Design Complier developed by Synopsys, Inc.

The synthesis process for the intermediate network involves the following two considerations:

(1) Minimizing delay: As discussed in the background section, the delay results from the time it takes for a signal to propagate from an input to an output. A longer delay slows down the speed of the signal processing. A synthesis tool typically reduces the delay of the network by reducing the number of levels between the inputs and the outputs.

(2) Sharing common logic: The area occupied by the logic network is ultimately a function of the number of transistors in a logic network. Therefore, the area can be reduced by sharing common logic, i.e., the process identifies common logic by determining during the synthesis process if two logic cones have an identical support nets. If so, one of the two logic cones is removed and the remaining cone is shared by two different outputs, or two different intermediate nodes.

Note that, the above synthesis goals are interrelated. Hence, achieving one goal may cause tradeoffs with another goal. Therefore, all the aspects of the synthesis should be weighted and the result will be an optimized intermediate network with the smallest area and shortest delay satisfying the design specifications.

Obtaining an Optimized Sub-network and Function Verification

Figure 8:
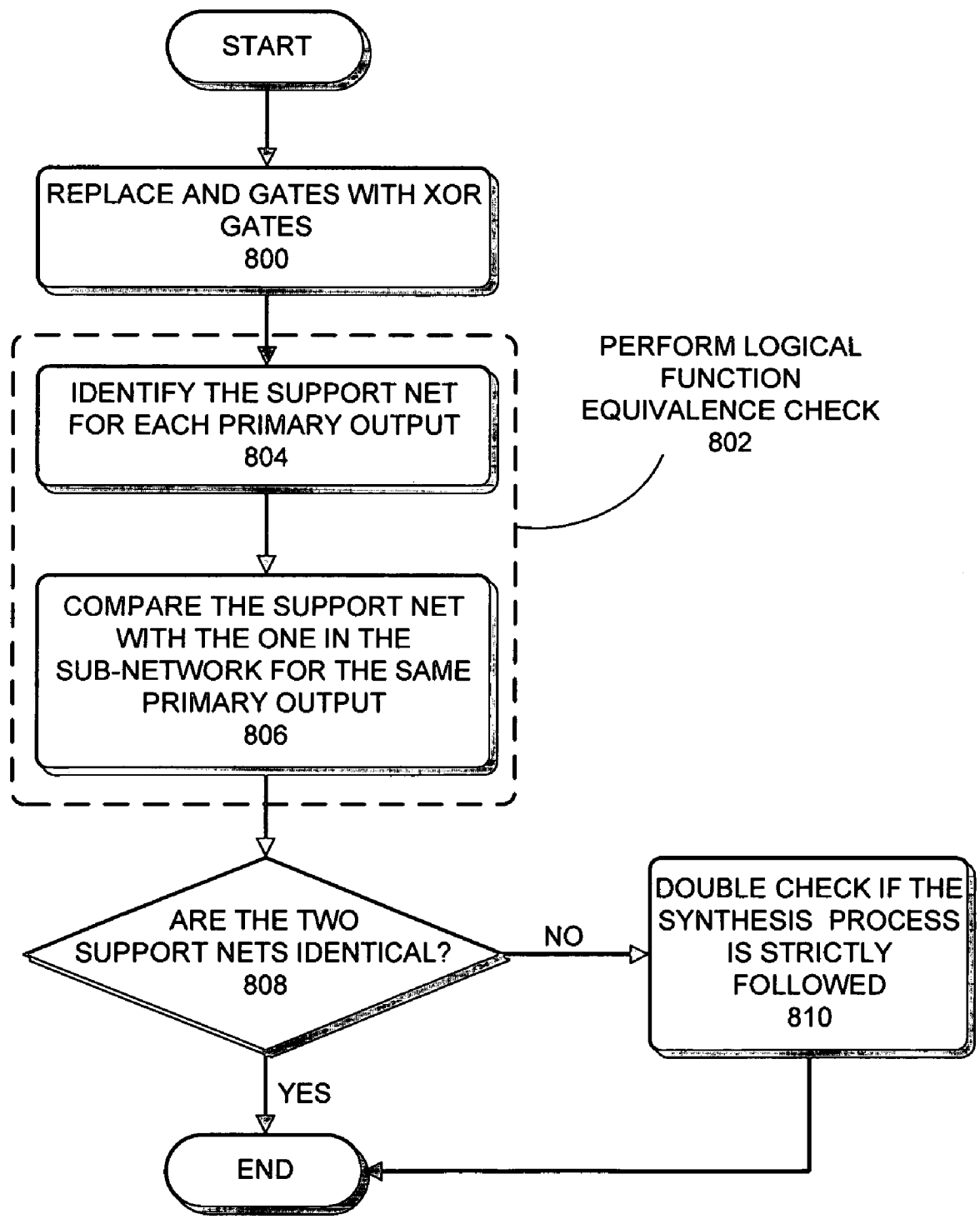
FIG. 8 presents a flowchart illustrating the process of producing an optimized XOR sub-network from the optimized intermediate logic network in accordance with an embodiment of the present invention.

Next, in the synthesis process flow, the process converts the optimized intermediate network to produce an optimized sub-network (step 408). FIG. 8 presents a flowchart illustrating the process of producing an optimized XOR sub-network from the optimized intermediate logic network in accordance with an embodiment of the present invention. The process begins by first replacing each AND gate (the "easy gate") in the optimized intermediate network with an XOR gate (step 800). Note that this is just a direct one to one replacement which retains the same outputs and same inputs (the support nets). Further, note that the new XOR network should have identical primary outputs to those of the original XOR sub-network. Next, the process verifies if the logical function of the new XOR sub-network is equivalent to the original XOR sub-network (step 802). In doing so, the process first identifies the support nets for each of the primary output (step 804). The process next compares these support nets with the support nets for the same primary output in the original XOR sub-network (step 806). If the two sets of support nets are identical, which means there are no missed or added inputs, logical equivalence is preserved in the optimized XOR sub-network (step 808).

Note that, this process of checking logical equivalence for XOR networks is very fast and straightforward. More complicated logic verification tools, such as Binary Decision Diagram (BDD), are not required (As a matter of fact, the BDD can even run out of memory if it is used for XOR network verification.) This is due to the fact that XOR gates have symmetric logic, therefore changing the order of the inputs in the support nets does not change the logical function. For example, A XOR B XOR C=C XOR A XOR B. This is true for a single XOR gate, and also for a multilevel XOR-tree. Therefore, the process of verifying logical functions for XOR networks require only checking for the completeness of the support nets for each primary output. Note that, if all the synthesis process steps described in FIG. 4 are strictly followed, the logical function should be preserved automatically. If, however, the support nets are found to be not identical, the user should re-examine all of the synthesis steps looking for possible process violations (step 810), for instance, an input that is missing from the support net by mistake.

Note that, the logical equivalence will fail if the same synthesis process is applied to asymmetric logic.

Furthermore, note that during the intermediate network (AND gates network) optimization, new redundancy may be introduced because "a AND a=a." If such redundant inputs are not removed from the new XOR gates, the logic will be incorrect due to the fact that "a XOR a=0." The invention has a procedure to fix such incorrect logic.

Timing Optimization

After obtaining the optimized XOR sub-network, the synthesis process in FIG. 4 can also perform an additional timing optimization (step 410). Typically, during IC design, the designer specifies a delay constraint between a primary input and a primary output, or registers. If a delay between a certain input and a certain output is found to be in violation of a delay constraint, an additional timing optimization step is required. Note that the delay referred to above not only includes a multi-level gate delay, which has been optimized in the sub-network, but also includes a wire delay caused by signal delays at the gate input due to the electrical properties of the input wires. The solution is to reroute this violation signal from the input of a lower level XOR gate (an early stage of the XOR network) to a input of a top level XOR gate (for example, the final stage of the network) which has a shorter gate level delay. This will shorten the delay between the input and the output for this signal, thereby satisfying the delay constraint. Note that the ability to reroute a signal from a lower level to a top level in the logic network, without changing the logical function again, is a consequence of the symmetric logic property of an XOR logic network.

Finally, during the synthesis process, the optimized XOR sub-network is ungrouped in the logic network 600 with all of its primary outputs, associated support nets and logical functionality unchanged (step 412).

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent. Additionally, the above disclosure is not intended to limit the present invention. The scope of the present invention is defined by the appended claims.

What is claimed is:

1. A method for optimizing a logic network, comprising:
receiving a first logic network;
identifying a sub-network within the first logic network, wherein the sub-network comprises only logic gates of a first type, wherein the sub-network defines a logical function;

creating an intermediate logic network based on the sub-network;
  wherein the intermediate logic network does not include the logic gates of the first type; and
  wherein the intermediate logic network defines an intermediate logical function which does not preserve the logical function of the sub-network;
optimizing the intermediate logic network using an optimization process that preserves the intermediate logical function to create an optimized intermediate logic network;
creating an optimized sub-network which preserves the logical function of the sub-network based on the optimized intermediate logic network that does not preserve the logical function of the sub-network; and
substituting the sub-network in the first logic network with the optimized sub-network, thereby optimizing the first logic network.

2. The method of claim 1, wherein the logic gates of the first type are XOR gates.

3. The method of claim 1, wherein creating the intermediate logic network based on the sub-network involves:
identifying primary outputs of the sub-network;
identifying primary inputs associated with each of the primary outputs;
removing redundant primary inputs;
removing the logic gates of the first type from the sub-network;
adding a logic gate of a second type for each of the primary outputs of the sub-network;
  wherein each primary output of the sub-network becomes the output of the logic gate of the second type;
  wherein the primary inputs of the sub-network become the inputs of the logic gate of the second type; and
  wherein the second type is one of:
    AND gate;
    OR gate; and
    any other type of symmetric gate.

4. The method of claim 3, wherein creating the optimized sub-network based on the optimized intermediate logic network involves:
replacing each logic gate of the second type in the optimized intermediate network with a logic gate of the first type, wherein the logic gate of the first type retains all the inputs and all the outputs of the logic gate of the second type;
verifying logical function for each primary output by:
  identifying a set of primary inputs associated with the primary output;
  comparing the set of primary inputs with the set of primary inputs associated with the same primary output in the sub-network; and
  confirming that the two sets of primary inputs are identical.

5. The method of claim 1, wherein optimizing the intermediate logic network using the optimization process involves:
minimizing timing delay by reducing logic levels between a primary input and a primary output; and
sharing common logic by:
  identifying common logic when two logic cones are found to have a same set of inputs, but different outputs; and
  if common logic is found, removing one of the logic cones.

6. The method of claim 1, wherein the logic gates of the first type are symmetric logic gates.

7. The method of claim 1, further comprising:
receiving a logic network, wherein the logic network comprises logic gates of different types;
identifying a sub-network within the logic network, wherein the sub-network comprises only logic gates of a first type;
optimizing the sub-network to produce an optimized sub-network; and
optimizing the logic network by substituting the sub-network with the optimized sub-network.

8. A computer-readable storage medium storing instructions that when executed by a computer cause the computer to perform a method for optimizing a logic network, the method comprising:
receiving a first logic network;
identifying a sub-network within the first logic network, wherein the sub-network comprises only logic gates of a first type, wherein the sub-network defines a logical function;
creating an intermediate logic network based on the sub-network;
  wherein the intermediate logic network does not include the logic gates of the first type; and
  wherein the intermediate logic network defines an intermediate logical function which does not preserve the logical function of the sub-network;
optimizing the intermediate logic network using an optimization process that preserves the intermediate logical function to create an optimized intermediate logic network;
creating an optimized sub-network which preserves the logical function of the sub-network based on the optimized intermediate logic network that does not preserve the logical function of the sub-network; and
substituting the sub-network in the first logic network with the optimized sub-network, thereby optimizing the first logic network.

9. The computer-readable storage medium of claim 8, wherein the logic gates of the first type are XOR gates.

10. The computer-readable storage medium of claim 8, wherein creating the intermediate logic network based on the sub-network involves:
identifying primary outputs of the sub-network;
identifying primary inputs associated with each of the primary outputs;
removing redundant primary inputs;
removing the logic gates of the first type from the sub-network;
adding a logic gate of a second type for each of the primary outputs of the sub-network;
  wherein each primary output of the sub-network becomes the output of the logic gate of the second type;
  wherein the primary inputs of the sub-network become the inputs of the logic gate of the second type; and
  wherein the second type is one of:
    AND gate;
    OR gate; and
    any other type of symmetric gate.

11. The computer-readable storage medium of claim 10, wherein creating the optimized sub-network based on the optimized intermediate logic network involves:
replacing each logic gate of the second type in the optimized intermediate network with a logic gate of the first type, wherein the logic gate of the first type retains all the inputs and all the outputs of the logic gate of the second type;
verifying logical function for each primary output by:
identifying a set of primary inputs associated with the primary output;
comparing the set of primary inputs with the set of primary inputs associated with the same primary output in the sub-network; and
confirming that the two sets of primary inputs are identical.

12. The computer-readable storage medium of claim 8, wherein optimizing the intermediate logic network using the optimization process involves:
minimizing timing delay by reducing logic levels between a primary input and a primary output; and
sharing common logic by:
identifying common logic when two logic cones are found to have a same set of inputs, but different outputs; and
if common logic if found, removing one of the logic cones.

13. The computer-readable storage medium of claim 8, wherein the logic gates of the first type are symmetric logic gates.

14. The computer-readable storage medium of claim 8, further comprising:
receiving a logic network, wherein the logic network comprises logic gates of different types;
identifying a sub-network within the logic network, wherein the sub-network comprises only logic gates of a first type;
optimizing the sub-network to produce an optimized sub-network; and
optimizing the logic network by substituting the sub-network with the optimized sub-network.

15. An apparatus for optimizing a logic network, comprising:
a receiving mechanism configured to receive a first logic network;
an identification mechanism configured to identify a sub-network within the first logic network, wherein the sub-network comprises only logic gates of a type, wherein the sub-network defines a logical function;
a creation mechanism configured to create an intermediate logic network based on the sub-network;
wherein the intermediate logic network does not include the logic gates of the first type; and
wherein the intermediate logic network defines an intermediate logical function does not preserve from the logical function of the sub-network;
an optimization mechanism configured to optimize the intermediate logic network using an optimization process that preserves the intermediate logical function to create an optimized intermediate logic network;
wherein the creation mechanism is additionally configured to create an optimized sub-network which preserves the logical function of the sub-network based on the optimized intermediate logic network that does not preserve the logical function of the sub-network; and
a substitution mechanism configured to substitute the sub-network in the first logic network with the optimized sub-network, thereby optimizing the first logic network.

16. The apparatus of claim 15, wherein the logic gates of the first type are XOR gates.

17. The apparatus of claim 15, wherein the creation mechanism is configured to:
identify primary outputs of the sub-network;
identify primary inputs associated with each of the primary outputs;
remove redundant primary inputs;
remove the logic gates of the first type from the sub-network;
add a logic gate of a second type for each of the primary outputs of the sub-network;
wherein each primary output of the sub-network becomes the output of the logic gate of the second type;
wherein the primary inputs of the sub-network become the inputs of the logic gate of the second type And
wherein the second type is one of:
AND gate;
OR gate; and
any other type of symmetric gate.

18. The apparatus of claim 17, wherein while creating the optimized sub-network, the creation mechanism is configured to:
replace each logic gate of the second type in the optimized intermediate network with a logic gate of the first type, wherein the logic gate of the first type retains all the inputs and all the outputs of the logic gate of the second type;
verify logical function for each primary output by:
identifying a set of primary inputs associated with the primary output;
comparing the set of primary inputs with the set of primary inputs associated with the same primary output in the sub-network; and
confirming that the two sets of primary inputs are identical.

19. The apparatus of claim 15, wherein the optimization mechanism is configured to:
minimize timing delay by reducing logic levels between a primary input and a primary output; and
share common logic by:
identifying common logic when two logic cones are found to have a same set of inputs, but different outputs; and
if common logic if found, removing one of the logic cone.

20. The apparatus of claim 15, wherein the logic gates of the first type are symmetric logic gates.

21. The apparatus of claim 15, further comprising:
a receiving mechanism configured to receive a logic network, wherein the logic network comprises logic gates of different types;
an identifying mechanism configured to identify a sub-network within the logic network, wherein the sub-network comprises only logic gates of a first type;
an optimization mechanism configured to optimize the sub-network to produce an optimized sub-network; and
an optimization mechanism configured to optimize the logic network by substituting the sub-network with the optimized sub-network.

* * * * *

UNITED STATES PATENT AND TRADEMARK OFFICE
CERTIFICATE OF CORRECTION

PATENT NO. : 7,346,862 B2  Page 1 of 1
APPLICATION NO. : 11/207274
DATED : March 18, 2008
INVENTOR(S) : Nan Zhuang It is certified that error appears in the above-identified patent and that said Letters Patent is hereby corrected as shown below:

In claim 15 (at column 11, line 43), please insert the word --first-- after the words "logic gates of a" so that the line reads: --sub-network comprises only logic gates of a first type--.

Signed and Sealed this

Fourteenth Day of April, 2009

JOHN DOLL
*Acting Director of the United States Patent and Trademark Office*